US006822489B2

(12) United States Patent
Motoike

(10) Patent No.: US 6,822,489 B2
(45) Date of Patent: Nov. 23, 2004

(54) SEMICONDUCTOR INTEGRATED CIRCUIT HAVING FET

(75) Inventor: Koichi Motoike, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/841,595

(22) Filed: Apr. 25, 2001

(65) Prior Publication Data

US 2002/0000620 A1 Jan. 3, 2002

(30) Foreign Application Priority Data

Apr. 26, 2000 (JP) .................................. 2000-126006

(51) Int. Cl.[7] .................................................. H03K 3/00
(52) U.S. Cl. ................................... 327/108; 327/434
(58) Field of Search ........................ 327/108–112, 434, 327/436, 437

(56) References Cited

U.S. PATENT DOCUMENTS

| | | | |
|---|---|---|---|
| 4,166,965 A | | 9/1979 | Curtice .......................... 326/36 |
| 4,338,582 A | * | 7/1982 | Presser ......................... 333/175 |
| 4,454,485 A | * | 6/1984 | Fisher .......................... 331/109 |
| 4,696,639 A | * | 9/1987 | Bohan, Jr. .................... 331/66 |
| 5,200,713 A | | 4/1993 | Grace et al. .................. 331/49 |
| 5,309,124 A | * | 5/1994 | Cazaux et al. ............... 333/139 |
| 5,345,123 A | * | 9/1994 | Staudinger et al. ........ 333/81 R |
| 5,475,875 A | | 12/1995 | Katsuyama et al. ......... 455/275 |
| 5,821,815 A | * | 10/1998 | Mohwinkel ................. 330/286 |
| 5,986,518 A | * | 11/1999 | Dougherty ................... 333/117 |
| 6,094,108 A | * | 7/2000 | Suematsu et al. ............. 333/25 |
| 6,252,474 B1 | * | 6/2001 | Mizutani ..................... 333/139 |

FOREIGN PATENT DOCUMENTS

EP     0 993 120     4/2000

OTHER PUBLICATIONS

Patent Abstracts of Japan, JP 10–336000, Dec. 18, 1998.
Patent Abstracts of Japan, JP 10–013204, Jan. 16, 1998.

* cited by examiner

*Primary Examiner*—Kenneth B. Wells
(74) *Attorney, Agent, or Firm*—Oblon, Spivak, McClelland, Maier & Neustadt, P.C.

(57) ABSTRACT

A semiconductor integrated circuit capable of decreasing the amount of signal transmission when an FET is in an OFF state and of improving a variable ratio of the amount of signal transmission, including an inductor element provided between the source terminal and ground terminal of an FET; and Lo input matching circuit provided between the gate terminal and input terminal of the FET; a bias supply circuit connected to the gate terminal of the FET; an RF output matching circuit provided between the drain terminal and output terminal of the FET; a control signal input circuit connected to the drain terminal of the FET; and a bias supply circuit connected to the source terminal of the FET. Since the reactance component of the gate-to-source impedance of the FET series-resonates with the inductor element 1 when the FET is in the OFF state, the amount of signal transmission can be sufficiently small when the FET is in the OFF state, and the variable ratio of the amount of signal transmission can be improved.

15 Claims, 7 Drawing Sheets

PRIOR ART

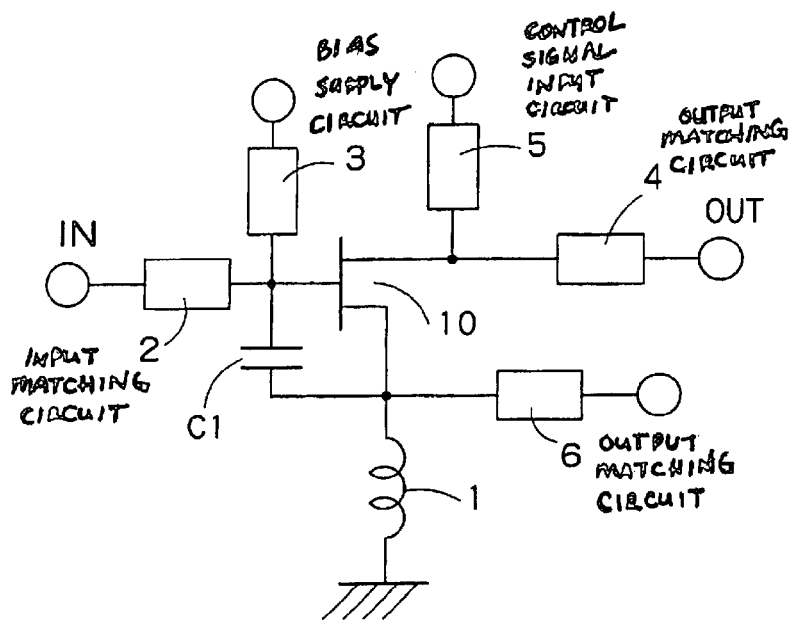
F I G. 4
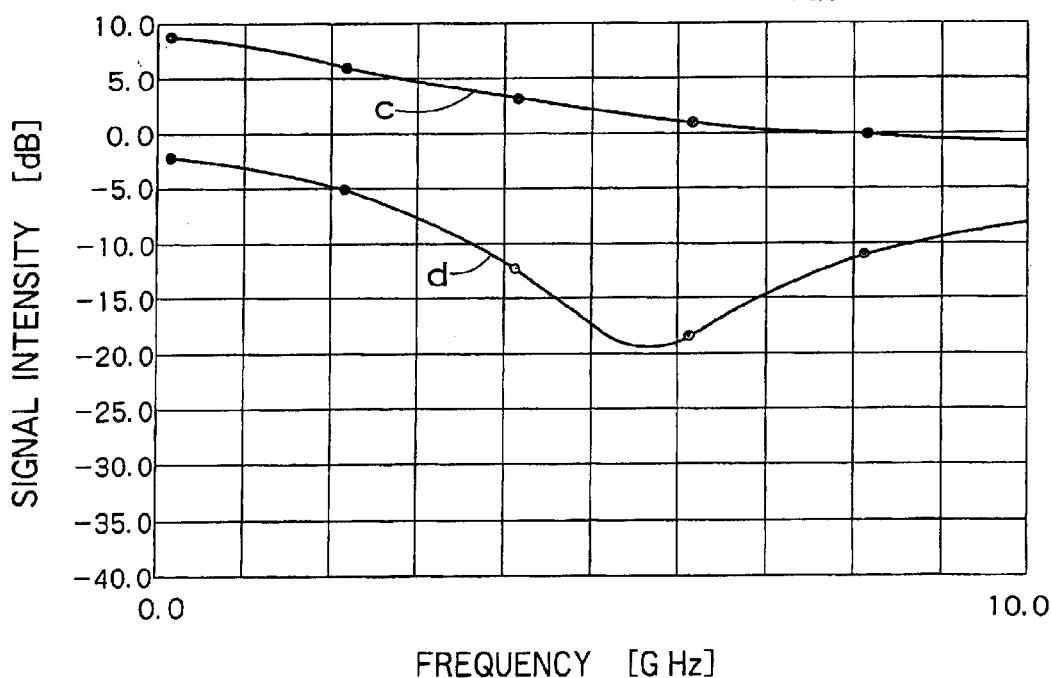
F I G. 5

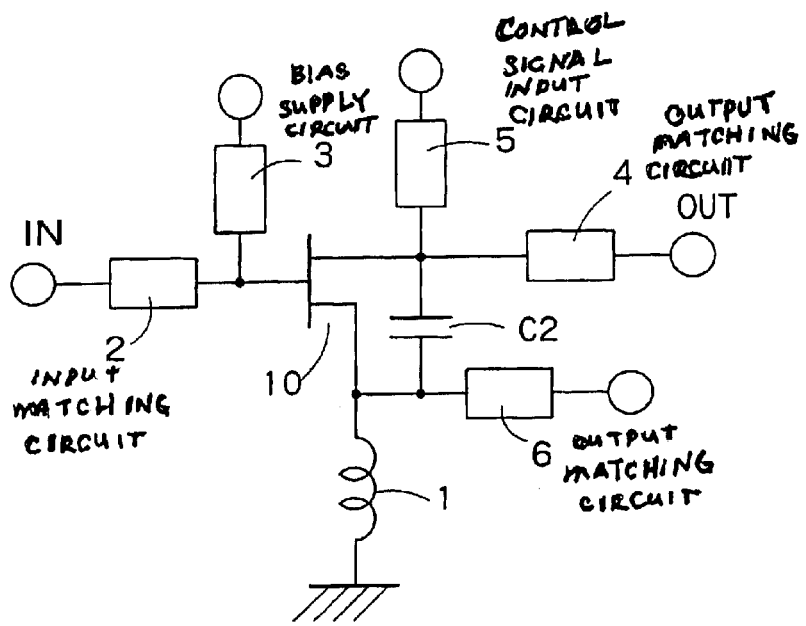
F I G. 6
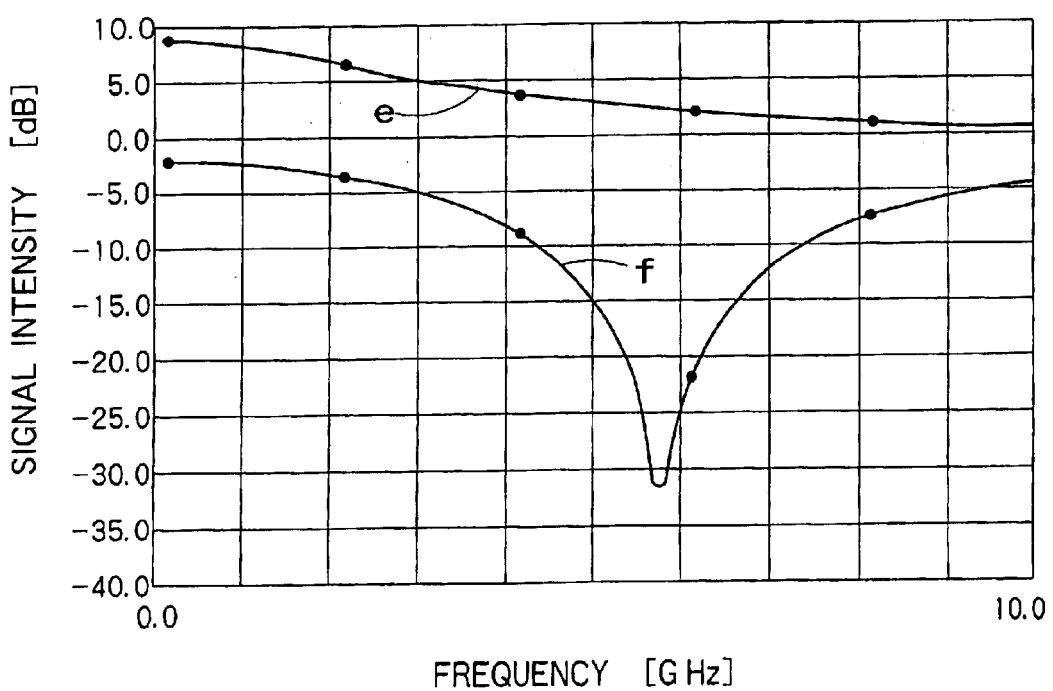
F I G. 7

SEMICONDUCTOR INTEGRATED CIRCUIT HAVING FET

CROSS REFERENCE TO RELATED APPLICATIONS

This application claims benefit of priority under 35USC § 119 to Japanese Patent Application No. 2000-126006, filed on Apr. 26, 2000, the entire contents of which are incorporated by reference herein.

BACKGROUND OF THE INVENTION

1. Field of the Invention

The present invention relates generally to a semiconductor integrated circuit having FETs for use in ICs or switches for ASK (Amplitude Shift Keying) modulation.

2. Related Background Art

If an FET (field-effect transistor) is used as a switch, the amount of signal transmission is preferably large when it is in an ON state, and the amount of signal transmission is preferably small when it is in an OFF state.

There has been provided a conventional circuit for decreasing the amount of signal transmission so that the drain-to-source voltage Vds of an FET is zero when the FET is in an OFF state. In a circuit of this type, it is difficult to suppress the amount of signal transmission to (−10 dB) or more per one stage of FETs due to the influence of the parasitic capacity of the FET.

FIG. 1 is an equivalent circuit diagram of an FET. Using this equivalent circuit, the reason why the amount of signal transmission cannot sufficiently be lowered when the FET is in the OFF state will be described below.

In FIG. 1, when the FET is in the OFF state, the relationship expressed by the following expressions (1) through (4) is established.

$$Ri, Rg, Rd, Rs \ll Rds \ll |1/(\omega \cdot Cds)| \quad (1)$$

$$gm = \text{about } 0 \quad (2)$$

$$Cgd = \text{about } Cgs \quad (3)$$

$$Rd \ll Rds \ll RL \quad (4)$$

From these expressions (1) and (4), signals inputted to a gate terminal are transmitted to a load resistance RL at a quantity depending on a product of Cgd/(Cgd+Cgs) and Rds/(Rds+RL).

Parameters such as Cgd, Cgs and Rds are functions of the drain-to-source voltage Vds of the FET, and the above described product is not zero when Vds=0.

On the other hand, when Vds is not zero, a product of Vc and gm is not zero, so that there is a problem in that the amount of signal transmission is increased by currents caused by the product of Vc and gm.

Even if the relationship expressed by the above described expressions (1) through (4) is satisfied and even if Vds is selected so that the product of Cgd/(Cgd+Cgs) and Rds/(Rds+RL) is minimum, both of gm and Vc are not zero, so that there is a problem in that the amount of signal transmission is increased by currents depending on the product of Vc and gm.

SUMMARY OF THE INVENTION

It is therefore an object of the present invention to eliminate the aforementioned problems and to provide a semiconductor integrated circuit capable of decreasing the amount of signal transmission when an FET is in an OFF state as small as possible and of improving a variable ratio of the amount of signal transmission.

In order to accomplish the aforementioned and other objects, according to one aspect of the present invention, a semiconductor integrated circuit comprises: an FET having a gate terminal configured to input a controlled signal and a drain terminal configured to output a signal corresponding to the controlled signal; and an inductor element provided between a source terminal and a ground terminal of the FET, wherein an inductance value of the inductor element is set so that the inductor element resonates in series for a reactance component of a gate-to-source impedance by the controlled signal when a drain voltage of the FET is lower than a source voltage thereof.

According to the present invention, since the inductor element is provided between the source terminal and ground terminal of the FET to cause the inductor element to resonate in series for the reactance component of the gate-to-source impedance when the drain voltage is lower than the source voltage, it is possible to reduce the amount of signal transmission when the FET is in the OFF state, and it is possible to improve the variable ratio of the amount of signal transmission.

By connecting the inductor element to the capacitor element in series between the source terminal and ground terminal of the FET, the dc component to originally flow through the inductor element can be interrupted by the capacitor element, so that it is possible to reduce electric power consumption.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 4 is a circuit diagram of the second preferred embodiment of a semiconductor integrated circuit according to the present invention;

FIG. 5 is a graph showing transfer characteristics (S21) of the FET of FIG. 4;

FIG. 6 is a circuit diagram of the third preferred embodiment of a semiconductor integrated circuit according to the present invention;

FIG. 7 is a graph showing transfer characteristics (S21) of the FET of FIG. 6;

DESCRIPTION OF THE PREFERRED EMBODIMENTS

Referring now to the accompanying drawings, preferred embodiments of a semiconductor integrated circuit according to the present invention will be described below in detail.

First Preferred Embodiment

Figure 1:
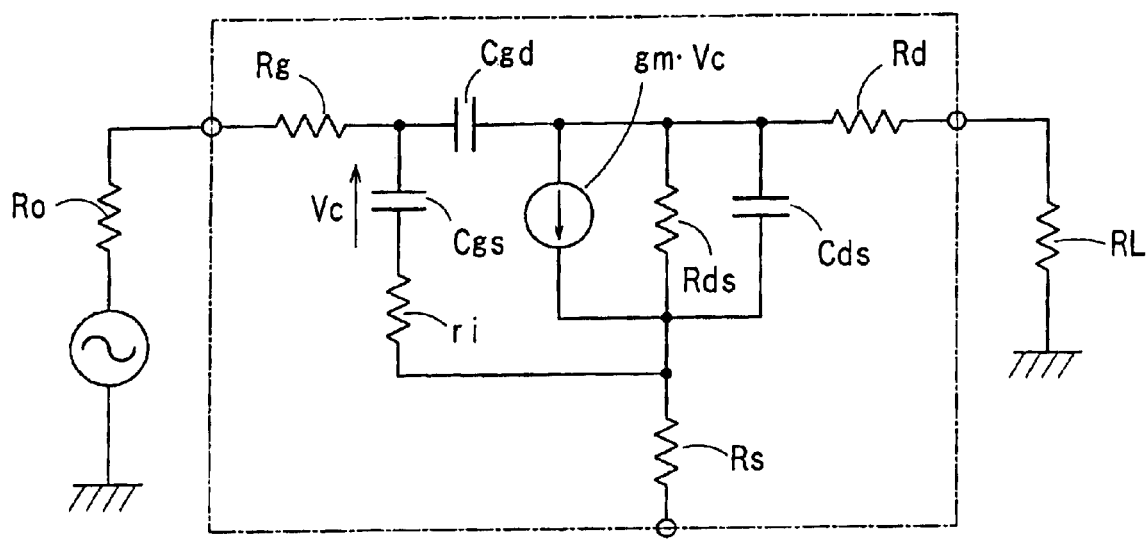
FIG. 1 is an equivalent circuit diagram of an EFT.
Figure 2:
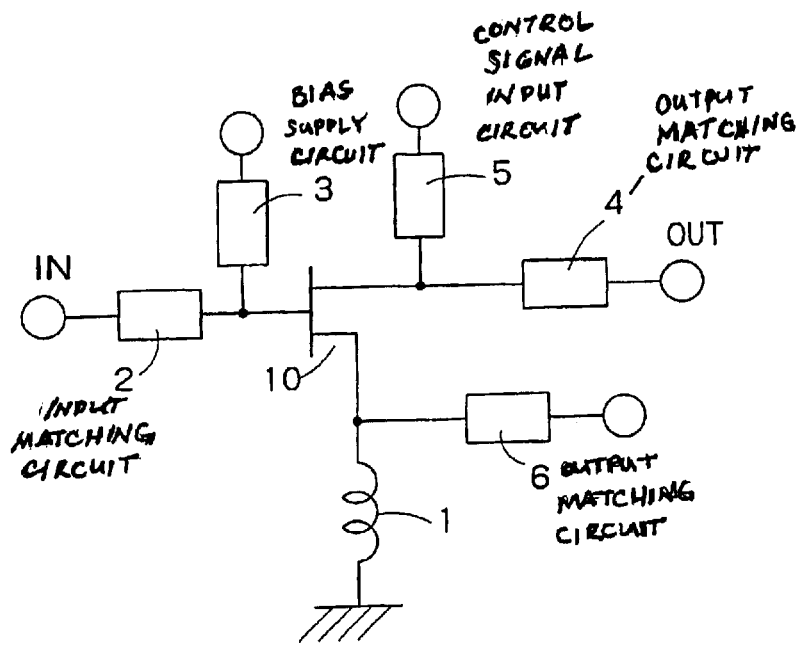
FIG. 2 is a circuit diagram of the first preferred embodiment of a semiconductor integrated circuit according to the present invention.

FIG. 2 is a circuit diagram of the first preferred embodiment of a semiconductor integrated circuit according to the present invention. In the semiconductor integrated circuit of FIG. 2, there is shown a principal part of an IC for ASK (Amplitude Shift Keying) modulation using a MES type FET made of a compound semiconductor (e.g., GaAs).

As compared with the conventional IC for ASK modulation, the circuit of FIG. 2 is characterized in that an inductor element (coil) 1 is provided between the source terminal and ground terminal of an FET 10.

Between the gate terminal and input terminal IN of the FET 10, an Lo input matching circuit 2 is provided. The gate terminal of the FET 10 is connected to a bias supply circuit 3. Between the drain terminal and output terminal OUT of the FET 10, an RF output matching circuit 4 is provided. The drain terminal of the FET 10 is connected to a control signal input circuit 5. The source terminal of the FET 10 is connected to a bias supply circuit 6.

By control signals from the control signal input circuit 5, the magnitude relationship between a drain voltage and source voltage of the FET 10 can be optionally switched and controlled. By bias signals from the bias circuits, the bias conditions of the FET 10 can be set to be optimum bias conditions.

In FIG. 2, the inductance value of the inductor element 1 provided between the source terminal and ground terminal of the FET 10 is set so that the inductor element 1 series-resonates with a reactance component of a gate-to-source impedance of the FET 10. If such a series resonance occurs, no signal is transmitted to the output side of the FET 10, so that it is possible to reduce the amount of signal transmission.

The reactance component Xc of the gate-to-source impedance of the FET 10 is expressed by expression (5):

$$Xc = \{-\omega \cdot (Cgd+Cgs) - \omega^3 \cdot Cgd^2 \cdot Cgs \cdot Rds^2\}/[(\omega^2 \cdot Cgd \cdot Cgs \cdot Rds)^2 + \{\omega \cdot (Cgs+Cgd)\}^2] \quad (5)$$

wherein $\omega = 2\pi f$ and f is a resonance frequency or desired frequency.

By substituting Xc obtained by expression (5) for the following expression (6), the inductance value of the inductor element 1 can be obtained.

$$|Xc|/\omega = L \quad (6)$$

When the FET 10 is in the OFF state, a resistance component R can be approximated by expression (7).

$$F = \{\omega^2 \cdot Cgd \cdot Rds \cdot (Cgs+Cgd) - \omega^2 \cdot Cgd \cdot Cgs \cdot Rds\}/[(\omega^2 \cdot Cgd \cdot Cgs \cdot Rds)^2 + \{\omega \cdot (Cgs+Cgd)\}^2] \quad (7)$$

Using expressions (6) and (7), Q indicative of a selectivity of signals can be expressed as expression (8).

$$Q = \omega L/R \quad (8)$$

Figure 3:
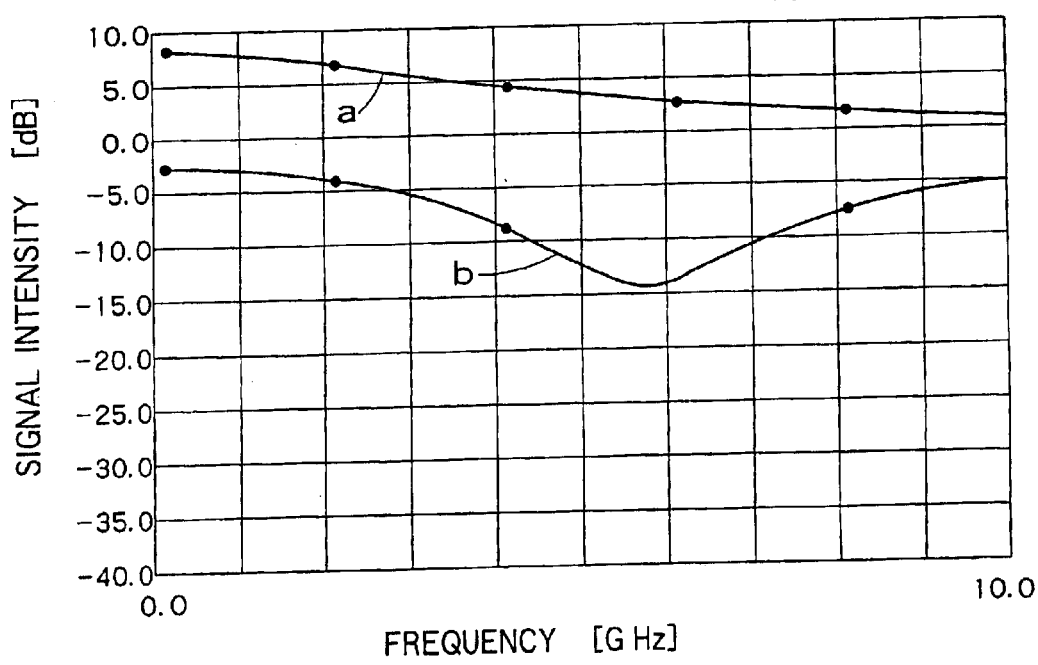
FIG. 3 is a graph showing transfer characteristics (S21) of the FET of FIG. 2.

FIG. 3 shows transfer characteristics (S21) of the FET 10 of FIG. 2. In the figure, curve a denotes an On characteristic, and curve b denotes an OFF characteristic. Furthermore, in FIG. 3, the axis of abscissas denotes frequencies (GHz), and the axis of ordinates denotes signal strengths (dB).

FIG. 3 shows an example where the FET 10 of FIG. 2 is formed supposing that a working band is in the range of 5 GHz to 6 GHz. As shown in this figure, it can be seen that the amount of signal transmission decreases to (−15 dB) or less in a frequency band of 5 to 6 GHz when the FET 10 is in the OFF state.

Furthermore, the control signal input circuit 5 sets the drain-to-source voltage of the FET 10 so that Cgd/(Cgd+Cgs)·Rds/(Rds+RL) is minimum when the FET 10 is in the OFF state.

Thus, in the first preferred embodiment, the inductor element 1 is provided between the source terminal and ground terminal of the FET 10, and the inductor element 1 resonates in series for the gate-to-source impedance of the FET 10, so that it is possible to sufficiently decrease the amount of signal transmission when the FET 10 is in the OFF state.

Second Preferred Embodiment

In the second preferred embodiment, a capacitor element is provided between the gate terminal and source terminal of the FET 10 in addition to the above described inductor element 1.

FIG. 4 is a circuit diagram of the second preferred embodiment of a semiconductor integrated circuit according to the present invention. In FIG. 4, the same reference numbers are given to the same elements as those in FIG. 2, and different points will be mainly described below.

The semiconductor integrated circuit of FIG. 4 has a capacitor element (second capacitor element) C1 provided between the gate terminal and source terminal of the FET 10, in addition to the construction of FIG. 2. By providing this capacitor element C1, the parasitic resistance component of the FET 10 apparently decreases, and Q increases.

When this capacitor element is provided, the reactance component of the FET 10 is expressed by expression (9).

$$Xc = \{-\omega \cdot (Cgd+Cgs+Ci) - \omega^3 \cdot Cgd^2 \cdot (Cgs+Ci) \cdot Rds^2\}/[\{\omega^2 \cdot Cgd \cdot (Cgs+Ci) \cdot Rds\}^2 + \{\omega \cdot (Cgs+Ci+Cgd)\}^2] \quad (9)$$

By substituting expression (9) for the above described expression (6), the inductance value of the inductor element 1 can be obtained.

In this case, a resistance component R can be approximated by expression (10).

$$F = \{\omega^2 \cdot Cgd \cdot Rds \cdot (Cgs+Ci+Cgd) - \omega^2 \cdot Cgd \cdot (Cgs+Ci) \cdot Rds\}/[\{\omega^2 \cdot Cgd \cdot (Cgs+Ci) \cdot Rds\}^2 + \{\omega \cdot (Cgs+Ci+Cgd)\}^2] \quad (10)$$

In this case, Q is expressed by $\omega L/R$.

FIG. 5 shows transfer characteristics (S21) of the FET 10 of FIG. 4. In the figure, curve c denotes an On characteristic, and curve d denotes an OFF characteristic.

FIG. 5 shows an example where the FET 10 of FIG. 4 is formed supposing that a working band is in the range of 5 GHz to 6 GHz. As shown in this figure, it can be seen that the amount of signal transmission decreases to (−20 dB) or less in a frequency band of 5 to 6 GHZ when the FET 10 is in the OFF state.

Thus, in the second preferred embodiment, since the capacitor element C1 is provided between the gate terminal and source terminal of the FET 10, it is possible to apparently decrease the parasitic resistance component of the FET 10, and the signal attenuation can be smaller than that in the first preferred embodiment.

Third Preferred Embodiment

In the third preferred embodiment, a capacitor element is provided between the drain terminal and source terminal of the FET 10, in addition to the above described inductor element 1.

FIG. 6 is a circuit diagram of the third preferred embodiment of a semiconductor integrated circuit according to the present invention. In FIG. 6, the same reference numbers are given to the same elements as those in FIG. 2, and different points will be mainly described below.

The semiconductor integrated circuit of FIG. 6 has a capacitor element (third capacitor element) C2 provided between the drain terminal and source terminal of the FET 10, in addition to the construction of FIG. 2. By providing this capacitor element C2, the parasitic resistance component of the FET 10 apparently decreases, and Q increases.

When this capacitor element is provided, the reactance component of the FET 10 is expressed by expression (11).

$$Xc=-[(\omega^2 \cdot Co \cdot Cgd \cdot Rds^2 + \omega^2 \cdot Co^2 \cdot Rds^2 + 1) \cdot \{(\omega \cdot Cgd + \omega^3 \cdot Co^2 \cdot Cgd \cdot Rds^2) + Cgs \cdot (\omega^3 \cdot Co \cdot Cgd \cdot Rds^2 + \omega^3 \cdot Co^2 \cdot Rds + \omega)\} - (\omega^3 \cdot Cgd^2 \cdot Rds \cdot Cgs)] \quad (11)$$

By substituting expression (11) for the above described expression (6), the inductance value of the inductor element 1 can be obtained.

In this case, a resistance component R can be approximated by expression (12).

$$F=[(\omega \cdot Cgd \cdot Rds) \cdot \{(\omega \cdot Cgd + \omega^3 \cdot Co^2 \cdot Cgd \cdot Rds^2) + Cgs \cdot (\omega^3 \cdot Co \cdot Cgd \cdot Rds^2 + \omega^3 \cdot Co^2 \cdot Rds + \omega)\} + (\omega^2 \cdot Co \cdot Cgd \cdot Rds^2 + \omega^2 \cdot Co \cdot Rds + 1) \cdot (\omega^2 \cdot Cgd \cdot Cgs)] \quad (12)$$

In this case, Q is expressed by ωL/R.

FIG. 7 shows transfer characteristics (S21) of the FET 10 of FIG. 6. In the figure, curve e denotes an On characteristic, and curve f denotes an OFF characteristic.

FIG. 7 shows an example where the FET 10 of FIG. 6 is formed supposing that a working band is in the range of 5 GHZ to 6 GHz. As shown in this figure, it can be seen that the amount of signal transmission decreases to (−25 dB) or less in a frequency band of 5 to 6 GHz when the FET 10 is in the OFF state.

Thus, in the third preferred embodiment, since the capacitor element is provided between the drain terminal and source terminal of the FET 10, it is possible to apparently decrease the parasitic resistance component of the FET 10, and the signal attenuation can be smaller than that in the first preferred embodiment.

Fourth Preferred Embodiment

The fourth preferred embodiment is a combination of the first through third preferred embodiment.

Figure 8:
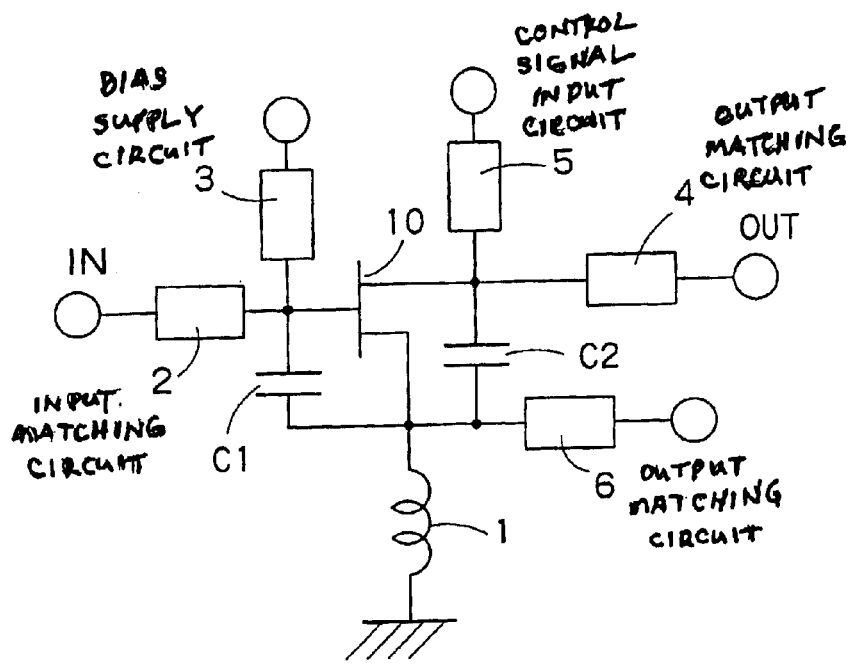
FIG. 8 is a circuit diagram of the fourth preferred embodiment of a semiconductor integrated circuit according to the present invention.

FIG. 8 is a circuit diagram of the fourth preferred embodiment of a semiconductor integrated circuit according to the present invention. In FIG. 8, the same reference numbers are given to the same elements as those in FIGS. 4 and 6, and different points will be mainly described below.

The semiconductor integrated circuit of FIG. 8 has a capacitor element C1 provided between the gate terminal and source terminal of the FET 10, and a capacitor element C2 provided between the drain terminal and source terminal of the FET 10, in addition to the construction of FIG. 2. Both of these capacitor elements C1 and C2 are provided for apparently decreasing the parasitic resistance component of the FET 10.

The reactance component Xc of the FET 10 of FIG. 8 is expressed by expression (13).

$$Xc=-[(\omega^2 \cdot Co \cdot Cgd \cdot Rds^2 + \omega^2 \cdot Co^2 \cdot Rds^2 + 1)$$
$$\cdot \{(\omega \cdot Cgd + \omega^3 \cdot Co^2 \cdot Cgd \cdot Rds^2)$$
$$+(Ci+Cgs) \cdot (\omega^3 \cdot Co \cdot Cgd \cdot Rds^2 + \omega^3 \cdot Co^2 \cdot Rds + \omega)\}$$
$$-\{(\omega^3 \cdot Cgd^2 \cdot Rds \cdot (Ci+Cgs))\}]$$
$$/[\omega \cdot Cgd + \omega^3 \cdot Co^2 \cdot Cgs \cdot Rds^2)$$
$$+(Ci+Cgs) \cdot (\omega^3 \cdot Co \cdot Cgd \cdot Rds^2 + \omega^3 \cdot Co^2 \cdot Rds + \omega)\}^2$$
$$+\{\omega^2 \cdot Cgd \cdot (Ci+Cgs)\}^2] \quad (13)$$

By substituting expression (13) for the above described expression (6), the inductance value of the inductor element 1 can be obtained.

In this case, a resistance component R can be approximated by expression (14).

$$F=[(\omega \cdot Cgd \cdot Rds) \cdot \{(\omega \cdot Cgd + \omega^3 \cdot Co^2 \cdot Cgd \cdot Rds^2)$$
$$+(Ci+Cgs) \cdot (\omega^3 \cdot Co \cdot Cgd \cdot Rds^2 + \omega^3 \cdot Co^2 \cdot Rds + \omega)\}$$
$$+(\omega^2 \cdot Co \cdot Cgd \cdot Rds^2 + \omega^2 \cdot Co \cdot Rds + 1)$$
$$\cdot \{\omega^2 \cdot Cgd \cdot (Ci+Cgs)\}] \quad (14)$$

In this case, Q is expressed by ωL/R.

Figure 9:
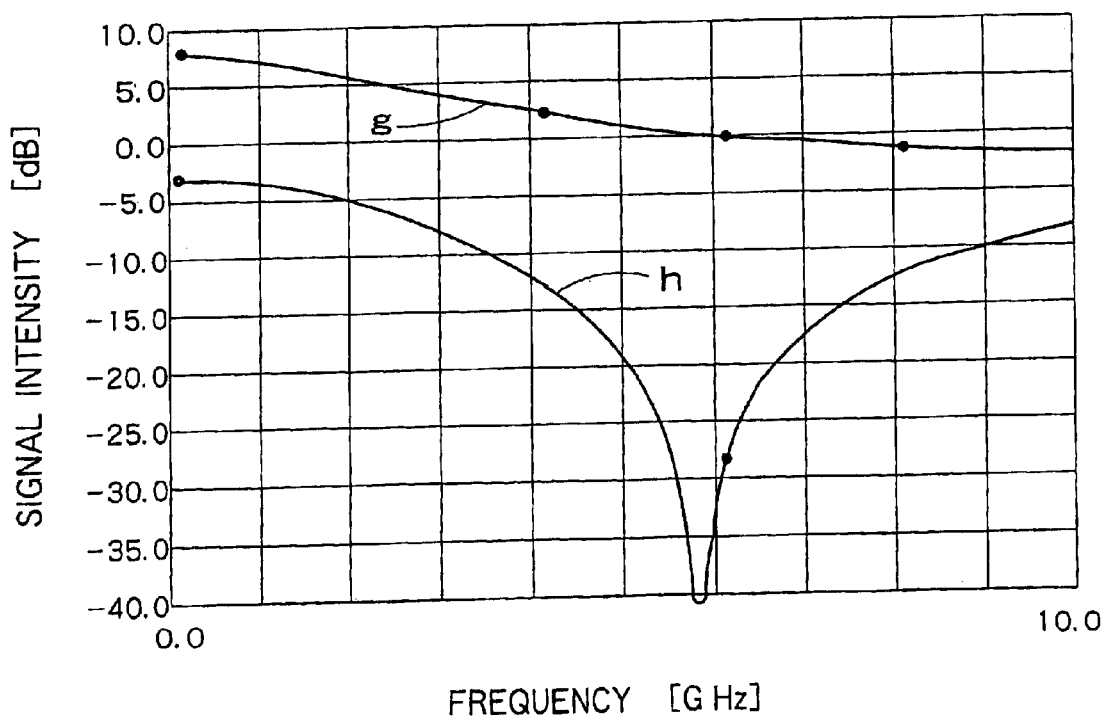
FIG. 9 is a graph showing transfer characteristics (S21) of the FET of FIG. 8.

FIG. 9 shows transfer characteristics (S21) of the FET 10 of FIG. 8. In the figure, curve g denotes an On characteristic, and curve h denotes an OFF characteristic.

FIG. 9 shows an example where the FET 10 of FIG. 8 is formed supposing that a working band is in the range of 5 GHz to 6 GHz. As shown in this figure, it can be seen that the amount of signal transmission decreases to (−30 dB) or less in a frequency band of 5 to 6 GHz when the FET 10 is in the OFF state.

Thus, in the fourth preferred embodiment, since the capacitor elements C1 and C2 are provided between the gate terminal and source terminal of the FET 10 and between the drain terminal and source terminal of the FET 10, it is possible to decrease the parasitic resistance component of the FET 10, and the signal attenuation can be smaller than those in the first though third preferred embodiments.

Fifth Preferred Embodiment

Since the inductor element 1 is provided between the source terminal and ground terminal of the FET 10 in the first through fourth preferred embodiments, there is a problem in that continuous currents flow from the bias supply circuit 6, which is connected to the source terminal, to the ground terminal via the inductor element 1, so that electric power consumption increases. Therefore, in the fifth preferred embodiment, the currents are interrupted.

Figure 10:
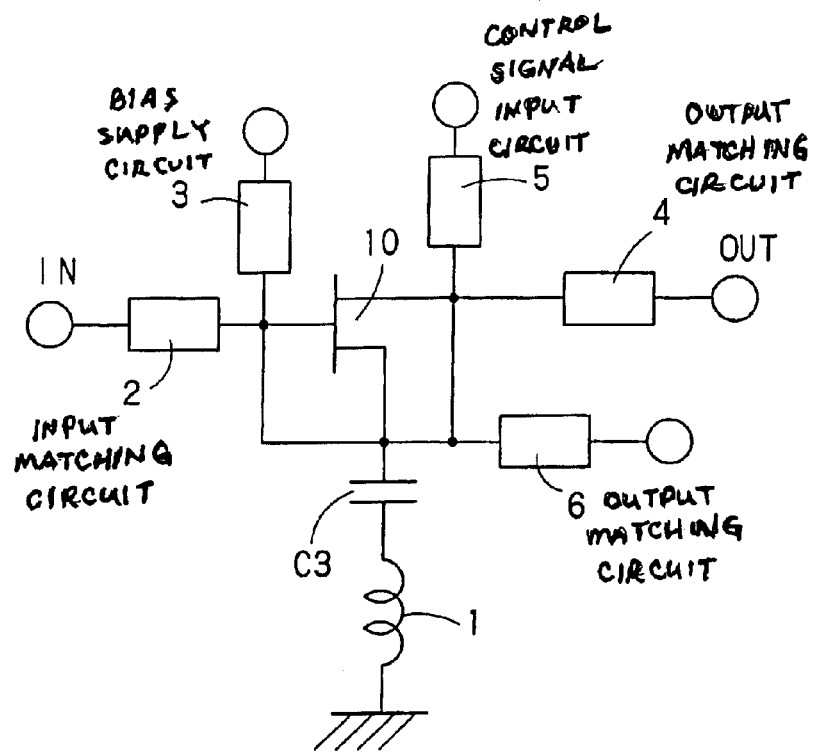
FIG. 10 is a circuit diagram of the fifth preferred embodiment of a semiconductor integrated circuit according to the present invention.

FIG. 10 is a circuit diagram of the fifth preferred embodiment of a semiconductor integrated circuit according to the present invention. In FIG. 10, the same reference numbers are given to the same elements as those in FIG. 8, and different points will be mainly described below.

The semiconductor integrated circuit of FIG. 10 is characterized in that an inductor element 1 is connected to a capacitor element (first capacitor element) C3 in series between the source terminal and ground terminal of an FET 10. Specifically, the capacitor element C3 is added to the construction of FIG. 8.

By the capacitor element C3, it is possible to prevent current from flowing through the inductor element 1 from a bias supply circuit 6 connected to the source terminal of the FET 10.

Furthermore, while FIG. 10 has shown the example where the capacitor element C3 is added to the circuit of FIG. 8, it is possible to reduce electric power consumption by adding the capacitor element C3 in FIGS. 2, 4 and 6.

Figure 11:
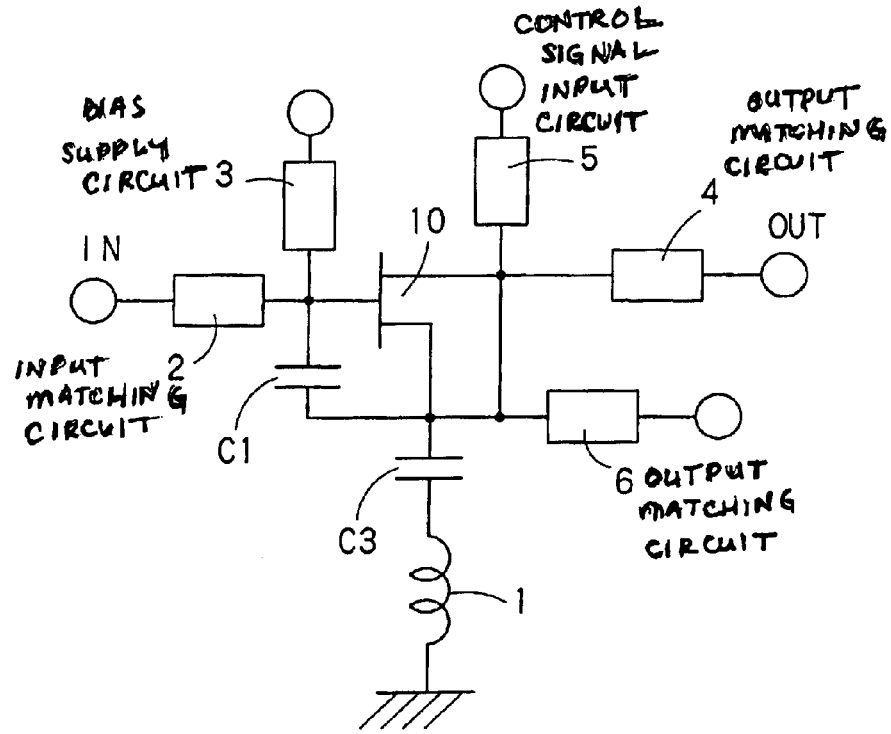
FIG. 11 is a circuit diagram wherein a capacitor element C3 is added to the circuit of FIG. 2.
Figure 12:
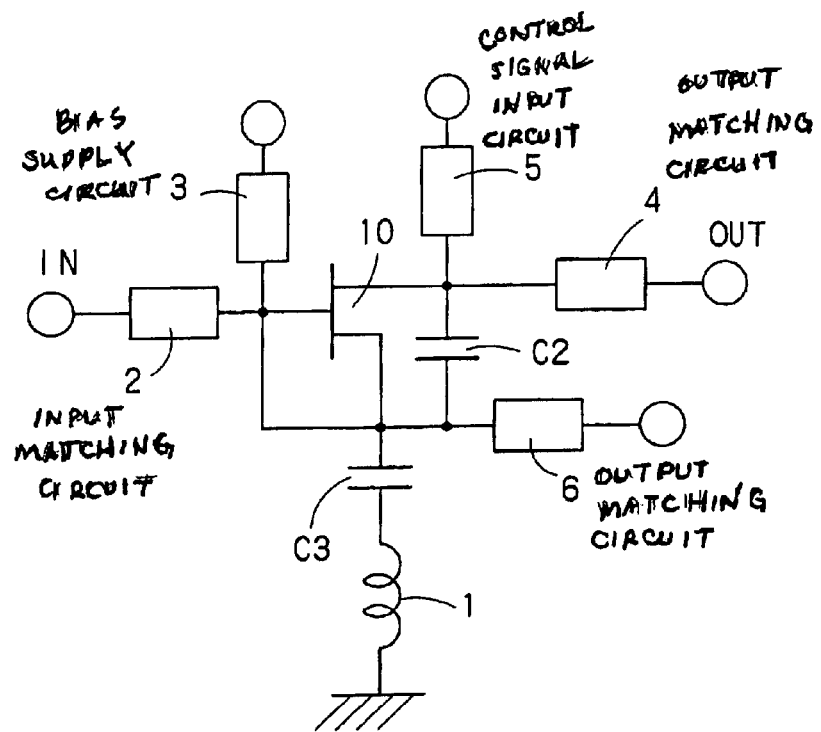
FIG. 12 is a circuit diagram wherein a capacitor element C3 is added to the circuit of FIG. 4.
Figure 13:
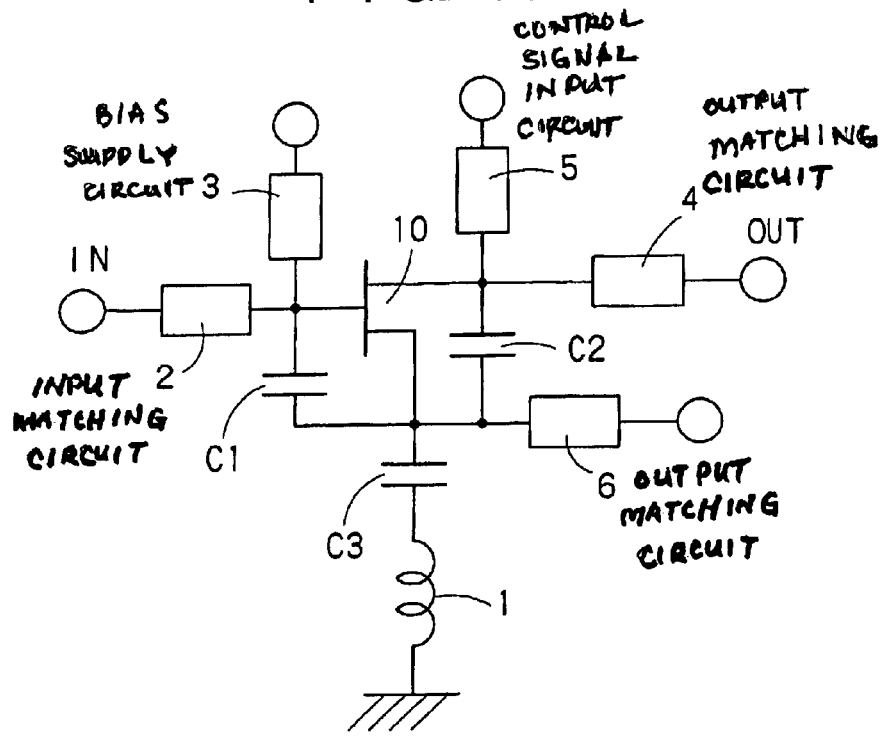
FIG. 13 is a circuit diagram wherein a capacitor element C3 is added to the circuit of FIG. 6.

For example, FIG. 11 shows an example where the capacitor element C3 is added to the circuit of FIG. 2, FIG. 12 shows an example where the capacitor element C3 is added to the circuit of FIG. 4, and FIG. 13 shows an example where the capacitor element C3 is added to the circuit of FIG. 6.

While examples where a semiconductor integrated circuit according to the present invention is applied to an IC for ASK modulation has been described in the above described preferred embodiments, the present invention can be utilized for other purposes than the ASK modulation. For example, the present invention may be applied to a switch formed of an FET.

While the control signal input circuit 5 and the bias supply circuits 3 and 6 have been connected to the respective terminals of the FET 10 in the above described preferred embodiments, the control signal input circuit 5 and the bias supply circuits 3 and 6 may be connected only to part of terminals of the FET 10.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor integrated circuit comprising:
   an FET having a gate terminal configured to input a controlled signal with a predetermined frequency and a drain terminal configured to output a signal corresponding to said controlled signal;
   an inductor element provided between a source terminal of said FET and a ground terminal, said inductor element having an inductance value selected in accordance with the predetermined frequency of said controlled signal and forming a series resonance circuit with a reactance component of a gate-to-source impedance when a drain voltage of said FET is lower than a source voltage thereof; and
   a second capacitor element provided between the gate terminal and the source terminal of said FET,
   wherein when a drain voltage of said FET is lower than a source voltage thereof, a series resonance circuit is formed of the reactance component of the gate-to-source impedance and said inductor element, and the inductance value of said inductor element is set in accordance with said predetermined frequency of said controlled signal, and
   a capacitance value of said second capacitor element is set so that a parasitic resistance component of said FET apparently decreases when the drain voltage of said FET is lower than the source voltage thereof.

2. The semiconductor integrated circuit according to claim 1, further comprises a control signal input circuit, connected to the drain terminal of said FET, configured to switch and controlling the magnitude relationship between the drain voltage and the source voltage of said FET.

3. The semiconductor integrated circuit according to claim 2, wherein said control signal input circuit sets a drain-to-source voltage so that $Cgd/(Cgd+Cgs) \cdot Rds/(Rds+RL)$, which is a function of the gate-to-drain capacity Cgd, gate-to-source capacity Cgs, drain-to-source resistance Rds and load resistance RL of said FET, is minimum when the drain voltage of said FET is lower than the source voltage thereof.

4. A semiconductor integrated circuit comprising:
   an FET having a gate terminal configured to input a controlled signal with a predetermined frequency and a drain terminal configured to output a signal corresponding to said controlled signal;
   an inductor element provided between a source terminal of said FET and a ground terminal, said inductor element having an inductance value selected in accordance with the predetermined frequency of said controlled signal and forming a series resonance circuit with a reactance component of a gate-to-source impedance when a drain voltage of said FET is lower than a source voltage thereof; and
   a second capacitor element provided between the drain terminal and the source terminal of said FET,
   wherein when a drain voltage of said FET is lower than a source voltage thereof, a series resonance circuit is formed of the reactance component of the gate-to-source impedance and said inductor element, and the inductance value of said inductor element is set in accordance with said predetermined frequency of said controlled signal, and
   a capacitance value of said second capacitor element is set so that a parasitic resistance component of said FET apparently decreases when the drain voltage of said FET is lower than the source voltage thereof.

5. The semiconductor integrated circuit according to claim 4, further comprises a control signal input circuit, connected to the drain terminal of said FET, configured to switch and controlling the magnitude relationship between the drain voltage and the source voltage of said FET.

6. The semiconductor integrated circuit according to claim 5, wherein said control signal input circuit sets a drain-to-source voltage so that $Cgd/(Cgd+Cgs) \cdot Rds/(Rds+RL)$, which is a function of the gate-to-drain capacity Cgd, gate-to-source capacity Cgs, drain-to-source resistance Rds and load resistance RL of said FET, is minimum when the drain voltage of said FET is lower than the source voltage thereof.

7. A semiconductor integrated circuit comprising:
   an FET having a gate terminal configured to input a controlled signal with a predetermined frequency and a drain terminal configured to output a signal corresponding to said controlled signal;
   an inductor element provided between a source terminal of said FET and a ground terminal, said inductor element having an inductance value selected in accordance with the predetermined frequency of said controlled signal and forming a series resonance circuit with a reactance component of a gate-to-source impedance when a drain voltage of said FET is lower than a source voltage thereof; and a control signal input circuit, connected to the drain terminal of said FET, configured to switch and controlling the magnitude relationship between the drain voltage and the source voltage of said FET, wherein said control signal input circuit sets a drain-to-source voltage so that Cgd/(Cgd+Cgs)·Rds/(Rds+RL), which is a function of the gate-to-drain capacity Cgd, gate-to-source capacity Cgs, drain-to-source resistance Rds and load resistance RL of said FET, is minimum when the drain voltage of said FET is lower than the source voltage thereof.

8. A semiconductor integrated circuit comprising:

an FET having a gate terminal configured to input a controlled signal with a predetermined frequency and a drain terminal configured to output a signal corresponding to said controlled signal;

an inductor element provided between a source terminal of said FET and a ground terminal, said inductor element having an inductance value selected in accordance with the predetermined frequency of said controlled signal and forming a series resonance circuit with a reactance component of a gate-to-source impedance when a drain voltage of said FET is lower than a source voltage thereof; and a bias supply circuit configured to supply a dc bias voltage to at least one of the gate terminal, drain terminal and source terminal of said FET.

9. A semiconductor integrated circuit comprising:

an FET having a gate terminal configured to input a controlled signal with a predetermined frequency and a drain terminal configured to output a signal corresponding to said controlled signal;

an inductor element and a first capacitor element which are connected to each other in series between a source terminal of said FET and a ground terminal, said inductor element having an inductance value selected in accordance with the predetermined frequency of said controlled signal and forming a series resonance circuit with a reactance component of a gate-to-source impedance when a drain voltage of said FET is lower than a source voltage thereof; and a second capacitor element provided between the gate terminal and the source terminal of said FET, wherein when a drain voltage of said FET is lower than a source voltage thereof, a series resonance circuit is formed of the reactance component of the gate-to-source impedance and said inductor element, and the inductance value of said inductor element is set in accordance with said predetermined frequency of said controlled signal, and a capacitance value of said second capacitor element is set so that a parasitic resistance component of said FET apparently decreases when the drain voltage of said FET is lower than the source voltage thereof.

10. The semiconductor integrated circuit according to claim 9, further comprises a control signal input circuit, connected to the drain terminal of said FET, configured to switch and controlling the magnitude relationship between the drain voltage and the source voltage of said FET.

11. The semiconductor integrated circuit according to claim 10, wherein said control signal input circuit sets a drain-to-source voltage so that Cgd/(Cgd+Cgs)·Rds/(Rds+RL), which is a function of the gate-to-drain capacity Cgd, gate-to-source capacity Cgs, drain-to-source resistance Rds and load resistance RL of said FET, is minimum when the drain voltage of said FET is lower than the source voltage thereof.

12. A semiconductor integrated circuit comprising:

an FET having a gate terminal configured to input a controlled signal with a predetermined frequency and a drain terminal configured to output a signal corresponding to said controlled signal;

an inductor element and a first capacitor element which are connected to each other in series between a source terminal of said FET and a ground terminal, said inductor element having an inductance value selected in accordance with the predetermined frequency of said controlled signal and forming a series resonance circuit with a reactance component of a gate-to-source impedance when a drain voltage of said FET is lower than a source voltage thereof; and a second capacitor element provided between the drain terminal and the source terminal of said FET, wherein when a drain voltage of said FET is lower than a source voltage thereof, a series resonance circuit is formed of the reactance component of the gate-to-source impedance and said inductor element, and the inductance value of said inductor element is set in accordance with said predetermined frequency of said controlled signal, and a capacitance value of said second capacitor element is set so that a parasitic resistance component of said FET apparently decreases when the drain voltage of said FET is lower than the source voltage thereof.

13. The semiconductor integrated circuit according to claim 12, further comprises a control signal input circuit, connected to the drain terminal of said FET, configured to switch and controlling the magnitude relationship between the drain voltage and the source voltage of said FET.

14. The semiconductor integrated circuit according to claim 13, wherein said control signal input circuit sets a drain-to-source voltage so that Cgd/(Cgd+Cgs)·Rds/(Rds+RL), which is a function of the gate-to-drain capacity Cgd, gate-to-source capacity Cgs, drain-to-source resistance Rds and load resistance RL of said FET, is minimum when the drain voltage of said FET is lower than the source voltage thereof.

15. A semiconductor integrated circuit comprising:

an FET having a gate terminal configured to input a controlled signal with a predetermined frequency and a drain terminal configured to output a signal corresponding to said controlled signal;

an inductor element and a first capacitor element which are connected to each other in series between a source terminal of said FET and a ground terminal, said inductor element having an inductance value selected in accordance with the predetermined frequency of said controlled signal and forming a series resonance circuit with a reactance component of a gate-to-source impedance when a drain voltage of said FET is lower than a source voltage thereof; and a control signal input circuit, connected to the drain terminal of said FET, configured to switch and control the magnitude relationship between the drain voltage and the source voltage of said FET, wherein when a drain voltage of said FET is lower than a source voltage thereof, a series resonance circuit is formed of the reactance component of the gate-to-source impedance and said inductor element, and the inductance value of said inductor element is set in accordance with said predetermined frequency of said controlled signal, and said control signal input circuit sets a drain-to-source voltage so that Cgd/(Cgd+Cgs)·Rds/(Rds+RL), which is a function of the gate-to-drain capacity Cgd, gate-to-source capacity Cgs, drain-to-source resistance Rds and load resistance RL of said FET, is minimum when the drain voltage of said FET is lower than the source voltage thereof.

* * * * *